United States Patent [19]

Marz

[11] Patent Number: 5,391,996
[45] Date of Patent: Feb. 21, 1995

[54] TECHNIQUES FOR GENERATING TWO HIGH FREQUENCY SIGNALS WITH A CONSTANT PHASE DIFFERENCE OVER A WIDE FREQUENCY BAND

[75] Inventor: Daniel J. Marz, Richboro, Pa.

[73] Assignee: General Instrument Corporation of Delaware, Hatboro, Pa.

[21] Appl. No.: 156,028

[22] Filed: Nov. 19, 1993

[51] Int. Cl.⁶ .......................... H03L 7/08; H03L 7/22
[52] U.S. Cl. ..................................... 327/158; 327/261; 327/2; 375/81
[58] Field of Search .......................... 331/2, 45, 23, 18; 328/155, 55; 307/262, 510, 511, 522; 375/120, 81

[56] References Cited

U.S. PATENT DOCUMENTS

| | | | |
|---|---|---|---|
| 3,978,424 | 8/1976 | Hobo et al. | 331/45 |
| 4,330,854 | 5/1982 | Zeitraeg | 370/100 |
| 4,338,569 | 7/1982 | Petrich | 328/155 |
| 4,339,631 | 7/1982 | Nishioka | 179/1 GS |
| 4,358,741 | 11/1982 | Nardin | 331/2 |
| 4,495,473 | 1/1985 | Treise | 331/10 |
| 4,518,920 | 5/1985 | Warner et al. | 328/14 |
| 4,528,522 | 7/1985 | Matsuura | 331/23 |
| 4,535,295 | 8/1985 | Kokuryo | 328/155 |
| 4,683,444 | 7/1987 | Kappeler | 331/25 |
| 4,912,433 | 3/1990 | Motegi et al. | 307/262 |
| 4,943,787 | 7/1990 | Swapp | 331/2 |
| 5,038,115 | 8/1991 | Myers et al. | 331/2 |
| 5,150,068 | 9/1992 | Kawashima et al. | 328/155 |
| 5,194,828 | 3/1993 | Kato et al. | 331/1 A |
| 5,298,866 | 3/1994 | Kaplinsky | 328/155 |
| 5,331,293 | 7/1994 | Shepherd et al. | 331/16 |

FOREIGN PATENT DOCUMENTS 1363427 12/1987 U.S.S.R. .

Primary Examiner—Timothy P. Callahan
Assistant Examiner—Terry L. Englund
Attorney, Agent, or Firm—Irwin Ostroff; Erwin W. Pfeifle

[57] ABSTRACT

Apparatus for generating two output signals with a selective predetermined constant phase difference therebetween from an input reference signal having a predetermined frequency and phase includes, in one embodiment, a first and a second Programmable Delay, and a first and a second Synthesizer. The input reference signal is provided as separate inputs to the first and second Programmable Delays which generate first and second output signals, respectively, with selective predetermined delay differences therebetween for transmission to the respective first and second Synthesizers. Each of first and second Synthesizers are phase locked loops with a Programmable Divider and an optional Prescaler added to the loop to divide a high frequency output signal generated by a Voltage Controlled Oscillator (VCO) to a frequency of the output signal from the associated Programmable Delay in order to correct for any phase difference between the output signal of the VCO and the input signal from the Programmable Delay. Various embodiments are provided that include a control loop that operates on the first and second output signals to generate a control signal to one of the Programmable Delays for maintaining a predetermined phase difference between the output signals from the apparatus.

22 Claims, 5 Drawing Sheets

TECHNIQUES FOR GENERATING TWO HIGH FREQUENCY SIGNALS WITH A CONSTANT PHASE DIFFERENCE OVER A WIDE FREQUENCY BAND

FIELD OF THE INVENTION

The present invention relates to techniques for generating two high frequency signals having a predetermined constant phase difference therebetween that is maintainable over a wide frequency range from a predetermined input signal.

BACKGROUND OF THE INVENTION

It is often necessary to provide two signals of a same frequency that have a specified phase difference therebetween over a broad bandwidth. For example, in a homodyne receiver, an input channel is transmitted to two mixers, and separate Local Oscillators generate output signals that have a same frequency and are 90 degrees out of phase with each other to drive the mixers. Various arrangements are known for generating two signals having a same frequency and a predetermined phase difference for specific purposes.

U.S. Pat. No. 4,330,854, issued to R. Zeitraeg on May 18, 1982, discloses apparatus for generating an exchange pulse train for use in a telecommunications system. The apparatus comprises first and second frequency adjustment phase locked loops which each receive a same standard pulse train at a predetermined frequency. The first and second phase locked loops generate a first and a second output master pulse train, respectively, and ensure that the two output master pulse trains are within a required predetermined frequency tolerance. The first and second master pulse trains are provided as inputs to a first and a second exchange pulse generator, respectively. Each of the first and second exchange pulse generators comprise a phase discriminator (PD), a low-pass filter, and a Voltage Controlled Oscillator (VCO) in series with a Frequency reducer in a feedback loop between the VCO and the PD, and produces a separate intermediate pulse train which is less than or equal to a predetermined maximum phase difference. One of a first and a second Frequency Reducer and Phase Synchronizer devices in the first and second exchange pulse generators, respectively, outputs a received exchange pulse train. Concurrently, the other Frequency Reducer and Phase Synchronizer compares the first and second intermediate pulse trains and produces an output exchange pulse train which is adjusted to have a same frequency as the other intermediate pulse train and to be within a predetermined phase tolerance.

U.S. Pat. No. 4,683,444, issued to O. Kappeler on Jul. 28, 1987, discloses a generator circuit for use in the field of analog quadrature mixture. The generator either generates first and second oscillator output signals or divides the output from a main oscillator into two oscillator output signals, and separately processes each oscillator output signal to generate two frequency variable sinusoidal output signals which are phase shifted by 90 degrees. In processing the two oscillator output signals, the second oscillator output signal is phase shifted by 90 degrees and each of the first oscillator signal and the second delayed oscillator output signal is separately multiplied with the other oscillator output signal before being separately low pass filtered in order to generate the two sinusoidal output signals.

U.S. Pat. No. 4,943,787, issued to M. Swapp on Jul. 24, 1990, discloses a digital time base generator for generating start and stop signals from a reference signal having a predetermined reference frequency. The reference signal is provided as an input to first and second phase locked loops (PLL) each comprising a VCO. Each PLL multiplies the reference frequency of the reference signal by a different predetermined integer amount than used by the other PLL. The resulting output signals are divided by separate dual modulus frequency dividers back down to the original reference frequency to produce the separate start and stop digital timing signals which have different waveform edges.

It is desirable to provide a relatively inexpensive and simple arrangement which generates a first and a second output signal having a selective predetermined constant phase difference therebetween from a single input reference signal, where the constant phase difference is maintainable when the input signal is varied over a wide frequency range.

SUMMARY OF THE INVENTION

The present invention is directed to method and apparatus for generating two high frequency signals having a predetermined constant phase difference therebetween that is maintainable over a wide frequency range from a predetermined input signal.

Viewed from one aspect, the present invention is directed to apparatus for providing a first and a second output signal with a predetermined phase difference therebetween from an input reference signal having a predetermined frequency and phase comprising splitting means, programmed phase delay means, and generating means. The splitting means receives the input reference signal and provides corresponding first and second output signals therefrom. The programmed phase delay means introduces a separate selective predetermined programmed phase delay into at least one of the corresponding first and second output signals received from the splitting means for generating first and second output signals having a predetermined phase difference therebetween. The generating means, which is responsive to the first and second output signals from the programmed phase delay means, generates first and second output signals from the apparatus having said predetermined phase difference therebetween.

Viewed from another aspect, the present invention is directed to apparatus for providing first and second output signals with a predetermined phase difference therebetween from an input reference signal comprising receiving means, a first programmable delay, a first synthesizer, a second programmable delay, and a second synthesizer. The receiving means receives the input reference signal and provides corresponding first and a second corresponding output signals therefrom. The first programmable delay introduces a predetermined phase delay into the first output signal from the receiving means, and generates a first delayed output signal. The first synthesizer receives the first delayed output signal and generates therefrom the first output signal from the apparatus having a predetermined frequency and phase. The second programmable delay introduces a predetermined phase delay into the second output signal from the receiving means, and generating a second delayed output signal, the second delayed output signal having a phase difference from the first delayed output signal from the first programmable delay that corresponds to the predetermined phase difference desired between the first and second output signals from the apparatus. The second synthesizer receives the second delayed output signal and generates therefrom the second output signal from the apparatus having both a predetermined frequency which is the same as the frequency of the output signal from the first synthesizer, and a predetermined phase that substantially differs from the first output signal by said predetermined phase difference.

Viewed from still another aspect, the present invention is directed to a method of providing first and second apparatus output signals with a predetermined phase difference therebetween from an input reference signal comprising the following steps. In a first step, the input reference signal is received and provides corresponding first and a second output signals therefrom. In a second step, a predetermined phase delay is introduced into the first output signal obtained in the first step with a first programmable delay for generating a first delayed output signal. In a third step, the first delayed output signal is received at a first synthesizer and the first apparatus output signal is generated therefrom having a predetermined frequency and phase. In a fourth step, a predetermined phase delay is introduced into the second output signal obtained in the first step with a second programmable delay for generating a second delayed output signal. The second delayed output signal has a phase difference from the first delayed output signal from the first programmable delay that corresponds to the predetermined phase difference desired between the first and second output signals from the apparatus. In a fifth step, the second delayed output signal is received at a second synthesizer and the second apparatus output signal is generated therefrom having a predetermined frequency which is the same as the frequency of the output signal from the first synthesizer, and a predetermined phase that substantially differs from the first apparatus output signal by the predetermined phase difference.

Viewed from still another aspect, the present invention is directed to a method of providing a first and a second output signal with a predetermined phase difference therebetween from an input reference signal having a predetermined frequency and phase comprising the following steps. In a first step, the input reference signal is received at a splitting means for providing corresponding first and a second output signals. In a second step, a separate selective predetermined programmed phase delay is introduced with a programmed phase delay means into at least one of the corresponding first and second output signals received from the splitting means for generating first and second output signals having a predetermined phase difference therebetween. In a third step, first and second output signals from the apparatus having said predetermined phase difference therebetween are generated by a generating means that is responsive to the first and second output signals from the second step.

The invention will be better understood from the following more detailed description taken with the accompanying drawings and claims.

DETAILED DESCRIPTION

It is to be understood that corresponding elements performing a same function in each of the figures have been given a same designation number.

Figure 1:
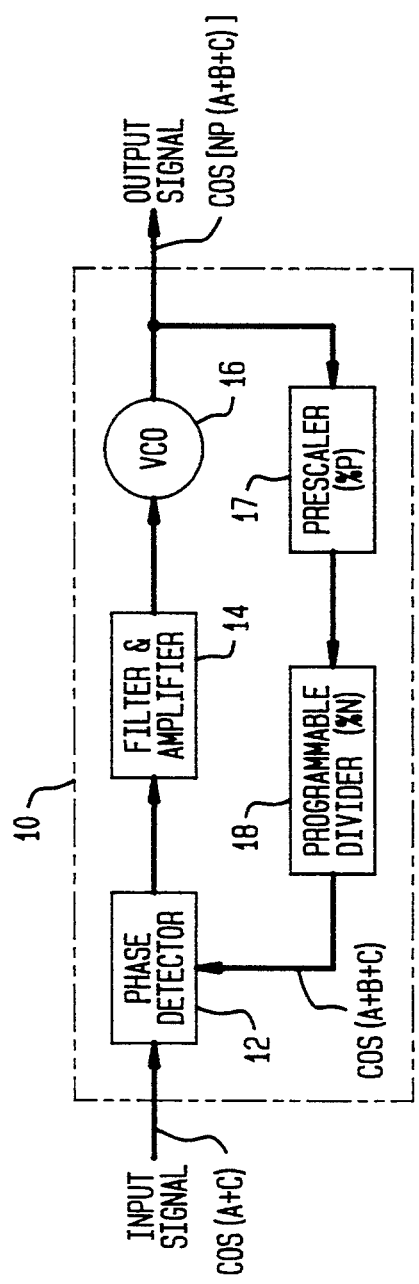
FIG. 1 is a block diagram of a prior art synthesizer.

Referring now to FIG. 1, there is shown a block diagram of a prior art Synthesizer 10 (shown within a dashed-line rectangle). The Synthesizer 10 comprises a Phase Detector 12, a Filter and Amplifier 14, and a Voltage Controlled Oscillator (VCO) 16 connected in series between an input and an output of the Synthesizer 10, and a Prescaler 17, and a Programmable Divider 18 located in a feedback loop between the output of the VCO 16 and an input to the Phase Detector 12. The Phase Detector 12 receives a reference input signal having a predetermined frequency and phase designated as $Cos(A+C)$ at a first input thereof, where A is equal to a predetermined frequency wt and C is a phase value. The Phase Detector 12 also receives a second input signal from the Programmable Divider 18 designated as $Cos(A+B+C)$ at a second input thereof, where B indicates a phase delay or phase difference from the input signal that is produced within the circuitry of the Synthesizer 10. For example, B equals 90 degrees when a Double-Balanced Mixer is used for the Phase Detector 12, whereas B equals 0 degrees if a Phase Frequency Detector is used for the Phase Detector 12. It is to be understood that in the Synthesizer 10 used hereinafter in the various embodiments of the present invention, the Phase Detector 12 preferably uses a Phase Frequency Detector such that B equals 0 degrees.

The Phase Detector 12 effectively compares or multiplies the input reference signal $Cos(A+C)$ and the input signal $Cos(A+B+C)$ from the Programmable Divider 18 to generate an output signal including a DC component and an AC component. The Filter and Amplifier 14 functions to remove the AC component produced within the Phase Detector 12 to generate an output signal which is a substantially pure DC control signal that is amplified to a predetermined amplitude. The control signal from the Filter and Amplifier 14 is transmitted to the VCO 16 to adjust an output signal from the VCO 16 to have a substantially constant frequency and phase. The output signal from the VCO 16 is a signal having a phase of $Cos(A+B+C)$ and a frequency which is NP times higher than the input reference signal and designated as $Cos[NP(A+B+C)]$ where N and P are predetermined percentages. The output signal from the VCO 16 is transmitted both as an output signal from the Synthesizer 10 and to an input of the Prescaler 17. The Prescaler 17 divides the output signal from the VCO 16 by a divisor P to produce an output signal of $Cos[N(A+B+C)]$ which is transmitted to the Programmable Divider 18. The Programmable Divider 18 divides the output signal from the Prescaler 17 by a divisor N to generate the output signal Cos(A+B+C) which is transmitted to the second input of the Phase Detector 12. The values of P and N can be programmed into a look-up table in the Prescaler 17 and Programmable Divider 18, respectively, by any suitable means as, for example, from an external microcomputer (not shown). It is to be understood that the Prescaler 17 is an optional device which is added in front of the Programmable Divider 18 because Programmable Dividers are limited in their input frequency range. Therefore, the output from the VCO 16 may have to be initially reduced by the Prescaler 17 to fall within an input frequency range of the Programmable Divider 18 where the output of the VCO is not already within that input frequency range.

Figure 2:
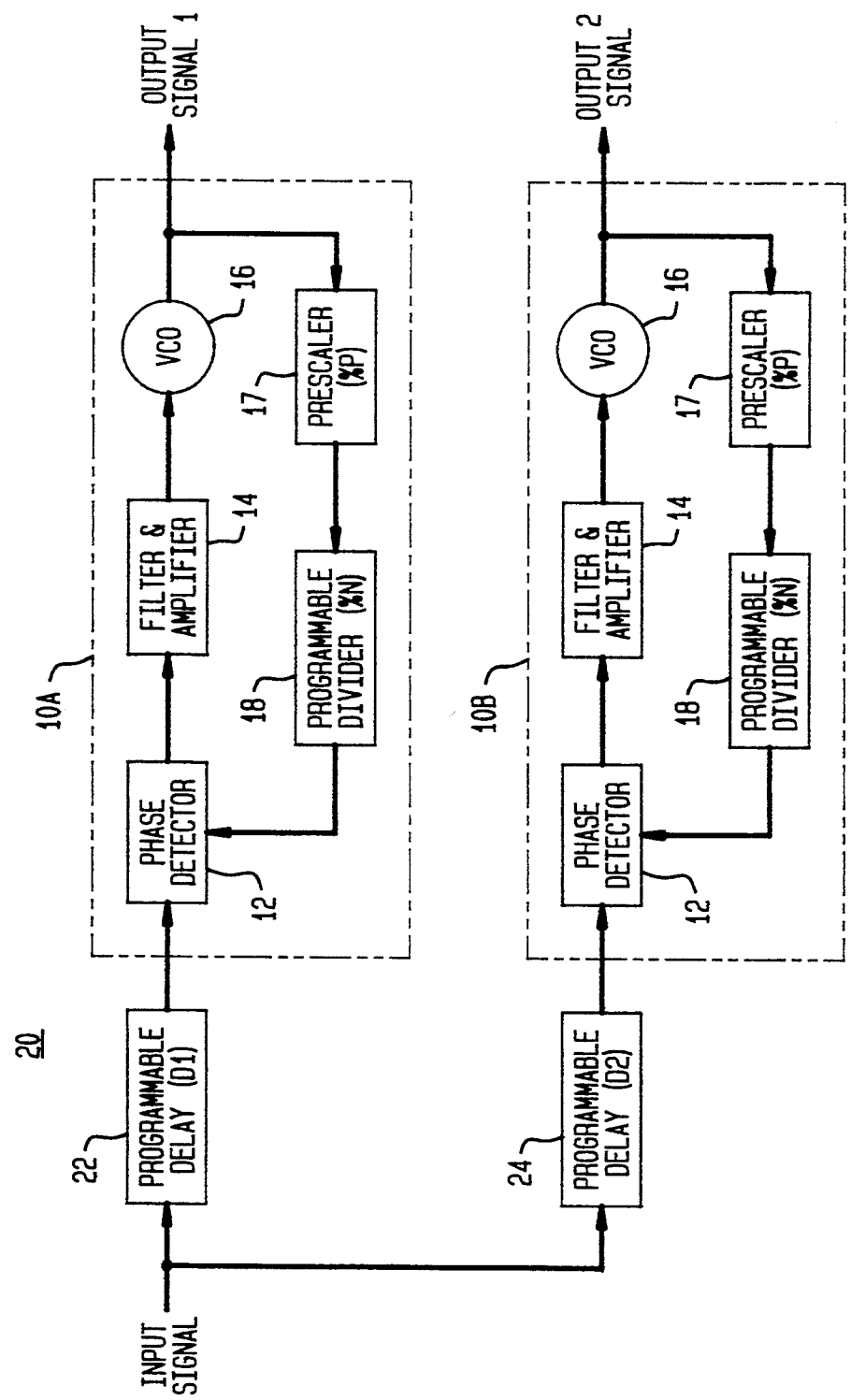
FIG. 2 is a block diagram of apparatus for generating two output signals with a constant phase difference from a single input reference signal in accordance with a first embodiment of the present invention.

Referring now to FIG. 2, there is shown a block diagram of apparatus 20 for generating a first and a second output signal with a constant phase difference therebetween from a single input reference signal in accordance with a first embodiment of the present invention. Apparatus 20 comprises a first Programmable Delay 22, a second Programmable Delay 24, a first Synthesizer 10A (shown within a dashed line rectangle), and a second Synthesizer 10B (shown within a dashed line rectangle), where each of the Synthesizers 10A and 10B is essentially the same as the Synthesizer 10 of FIG. 1. In apparatus 20, an input reference signal (INPUT SIGNAL), which has a predetermined frequency and phase, is transmitted to an input of each of the first and second Programmable Delays 22 and 24. The output from the first Programmable Delay 22 is coupled to an input of the first Synthesizer 10A, and the output from the second Programmable Delay 24 is coupled to an input of the second Synthesizer 10B. The first and second Synthesizers 10A and 10B provide separate output signals designated OUTPUT SIGNALS 1 and 2, respectively.

In operation, each of the first and second Programmable Delays 22 and 24 concurrently receive the input reference signal. The first Programmable Delay 22 is programmed to introduce a first predetermined delay (D1) into the received input reference signal and generate a delayed output reference signal for transmission to the Synthesizer 10A. Similarly, the second Programmable Delay 24 is programmed to introduce a selective predetermined delay (D2), which is different than the predetermined delay introduced by the first Programmable Delay 22, into the received input reference signal, and to generate a delayed output reference signal for transmission to the second Synthesizer 10B. The selective amount of the predetermined delays introduced by each of the first and second Programmable Delays 22 and 24 is achieved using any suitable known method. For example, a first predetermined delay (D1) and a second predetermined delay (D2) can be programmed into a look-up table in each of the first and second Programmable Delays 22 and 24, respectively, from an external microcomputer (not shown) or any other suitable control means. As a result, the delayed output reference signals generated and transmitted by the first and second Programmable Delays 22 and 24 have a predetermined phase difference therebetween which corresponds to a desired phase difference between the first and second output signals from the apparatus 20.

Each of the first and second Synthesizers 10A and 10B comprises a Phase Detector 12, a Filter and Amplifier 14, a VCO 16, an optional Prescaler 17 and a Programmable Divider 18 arranged as described for the Synthesizer 10 of FIG. 1. The first and second Synthesizers 10A and 10B are substantially matched Synthesizers and operate on the delayed output reference signals received from the first and second Programmable Delays 22 and 24, respectively, in the manner described for the Synthesizer 10 of FIG. 1 to generate the respective first and second output signals from arrangement 20. More particularly, the first and second Synthesizers 10A and 10B provide separate output signals designated OUTPUT SIGNALS 1 and 2, respectively, which have the same frequency and a predetermined phase difference therebetween. It is to be understood that the apparatus 20 can be programmed to provide any desired phase difference between the two output signals. To obtain a desired phase difference between the two output signals from apparatus 20, the appropriate delays (D1 and D2) are programmed into the first and second Programmable Delays 22 and 24, along with the values of P and N used by the Programmable Prescalers 17 and Dividers 18, respectively, in the associated first and second Synthesizers 10A and 10B.

More particularly, assuming that the input reference signal is Cos(A+C), then the output (PHD1) from the first Programmable Delay 22 is Cos(A+C+D1) and the output (PHD2) from the second Programmable Delay 24 is Cos(A+C+D2), where A is equal to wt and C is some predetermined phase. The phase (PH1) at the output of the VCO 16 (and the input to the Prescaler 17) of the first Synthesizer 10A is:

$$PH1 = (N)(P)(PHD1) = (N)(P)(A+B1+C+D1),$$

or $$PH1 = (N)(P)[(A+B1+C)+(N)(P)(D1)],$$

where B1 is a phase introduced in Synthesizer 10A. Similarly, the phase (PH2) at the output of the VCO 16 (and the input to the Prescaler 17) of the second Synthesizer 10B is:

$$PH2 = (N)(P)(PHD2) = (N)(P)(A+B2+C+D2),$$

or $$PH2 = (N)(P)(A+B2+C)+(N)(P)(D2),$$

where B2 is a phase introduced in Synthesizer 10B, and in theory corresponds to B1 when the Synthesizers 10A and 10B are matched synthesizers. The phase difference (PH) between the outputs of the VCOs of the first and second Synthesizers 10A and 10B is:

$$PH = PH1 - PH2$$

which is also represented by:

$$PH = (N)(P)[(A+C)+(N)(P)(B1)] - (N)(P)\\ [(A+C)+(N)(P)(B2)];$$

or $$PH = (N)(P)(D1) - (N)(P)(D2) = (N)(P)(D1-D2).$$

It is to be understood that the value of the phase difference PH is the required phase difference between the first and second output signals (Output Signals 1 and 2) from the apparatus 20, and can be determined from:

$$D2 - D1 = PH/(N)(P).$$

This expression implies that in order to maintain a constant phase difference between the output signals from the first and second Synthesizers 10A and 10B across the output frequency range, the delays D1 and D2 must be adjusted accordingly.

Figure 3:
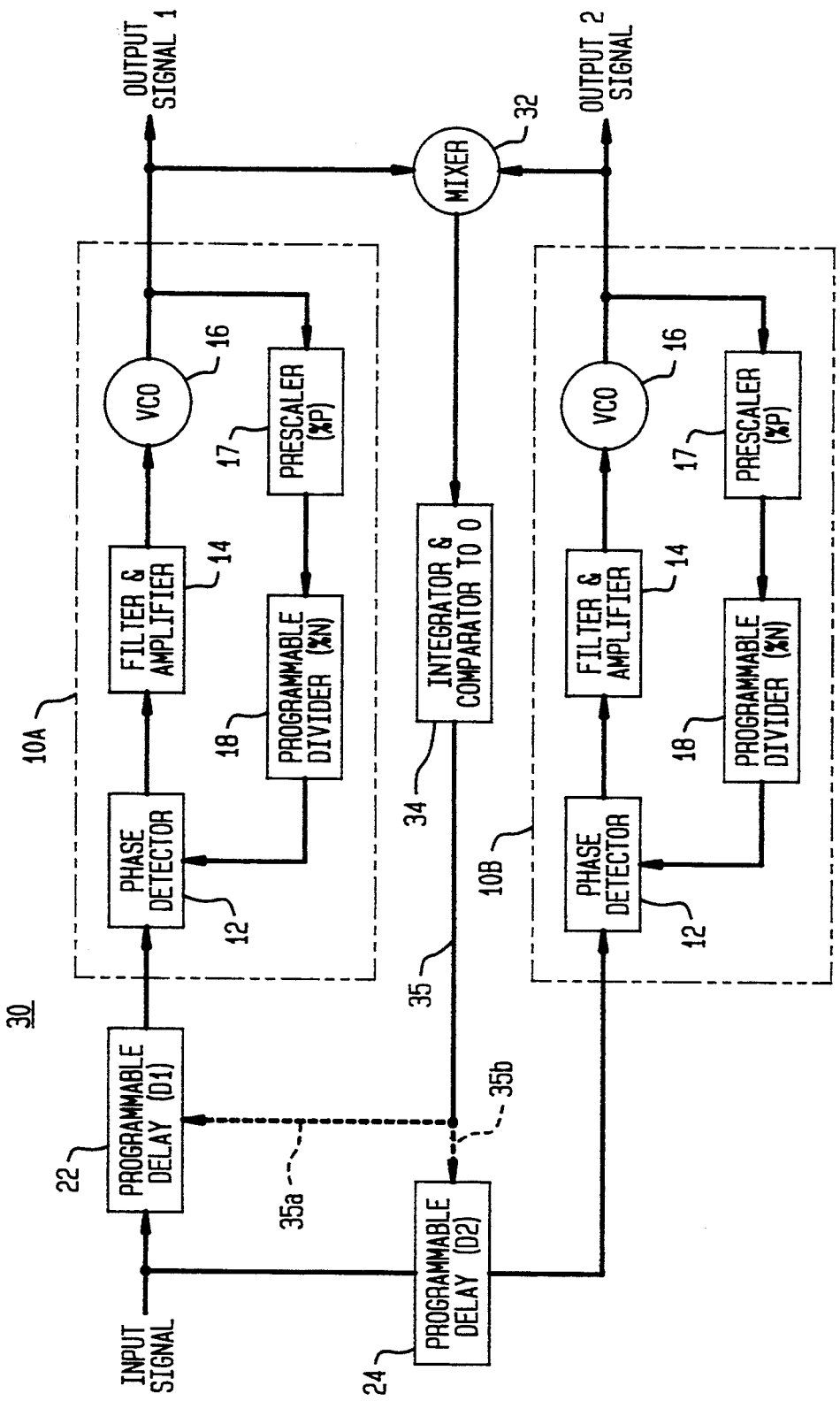
FIG. 3 is a block diagram of apparatus for generating two output signals with a constant phase difference of 90 degrees from a single input reference signal in accordance with a second embodiment of the present invention.

Referring now to FIG. 3, there is shown a block diagram of apparatus 30 for generating two output signals with a constant phase difference of 90 degrees from a single input reference signal in accordance with a second embodiment of the present invention. Apparatus 30 comprises a first Programmable Delay 22, a second Programmable Delay 24, a first Synthesizer 10A, a second Synthesizer 10B, a Mixer 32, and an Integrator and Comparator to Zero 34, where each of the Synthesizers 10A and 10B are essentially the same as the Synthesizer 10 of FIG. 1. In apparatus 30, an input reference signal (INPUT SIGNAL), which has a predetermined frequency and phase, is transmitted to an input of each of the first and second Programmable Delays 22 and 24. The output from the first Programmable Delay 22 is coupled to an input of the first Synthesizer 10A, and the output from the second Programmable Delay 24 is coupled to an input of the second Synthesizer 10B. The first and second Synthesizers 10A and 10B provide separate output signals designated OUTPUT SIGNALS 1 and 2, respectively. The operation of the Programmable Delays 22 and 24 and the first and second Synthesizers 10A and 10B corresponds to the operation of the corresponding elements in the apparatus 20 of FIG. 2.

In apparatus 30, however, the output signals from the first and second Synthesizers 10A and 10B are coupled to separate inputs of the Mixer 32 which is preferably a double-balanced mixer that multiplies the two output signals from the Synthesizers 10A and 10B to generate a mixer output signal at an output thereof. The mixer output signal is transmitted to the Integrator and Comparator To Zero 34 where the mixer output signal is integrated and compared to zero. By definition, the integral of the multiplication of two orthogonal signals (90 degree phase difference as sine or cosine values) is equal to zero over a period of the signal (or in practical terms, a very long integration time). More particularly, a DC output of the balanced mixer 32 is zero only if the phase difference between the output signals from the first and second Synthesizers 10A and 10B have a phase difference of 90 degrees. A resultant output control signal from the Integrator and Comparator To Zero 34 is transmitted via a conductor 35 to a separate input of the first Programmable Delay 22 via a conductor 35a (shown as a dashed line) or to a separate input of the second Programmable Delay 24 via a conductor 35b (shown as a dashed line). The output control signal from the Integrator and Comparator To Zero 34 is used to adjust the reference delay D1 or D2 in the associated Programmable Delay 22 or 24, respectively, to maintain the phase difference at the output of the first and second Synthesizers 10A and 10B substantially at 90 degrees. It is to be understood that the constant phase difference of 90 degrees between the output signals from the first and second Synthesizers 10A and 10B is automatically maintained using the apparatus 30 when the frequency of the input reference signal to the apparatus 30 is varied. Such constant 90 degree phase difference over a wide frequency range is accomplished by the Mixer 32 and Integrator and Comparator To Zero 34 continuously adjusting the delay in one of the Programmable Delays 22 or 24 to provide an appropriate D1-D2 value to produce a 90 degree phase difference between the two output signals for any change in the frequency of the input signal.

More particularly, the double-balanced Mixer 32 is effectively a multiplier whose output can be written as:

$$[\cos(X+N+P+D1)][\cos(X+N+P+D2)] = [\cos(X+Y1)][\cos(X+Y2)]$$

which is also equal to $$= [\tfrac{1}{2}][\cos(Y1-Y2) + \cos(2X+Y1+Y2)],$$

where $Y1=(N)(P)(D1)$, $Y2=(N)(P)(D2)$, and X is an predetermined frequency value of wt. The output of the Integrator portion of the Integrator and Comparator To Zero 34 is $[\tfrac{1}{2}][\cos(Y1-Y2)]$. The Comparator To Zero portion of the Integrator and Comparator To Zero 34 compares the resultant DC voltage to a value of zero and provides a control output signal to one of the Programmable Delays 22 or 24 to adjust the delay in the Programmable Delay (22 or 24) until the DC voltage equals zero. This implies that for the DC voltage to equal zero, then (Y1−Y2) must equal 90 degrees.

Figure 4:
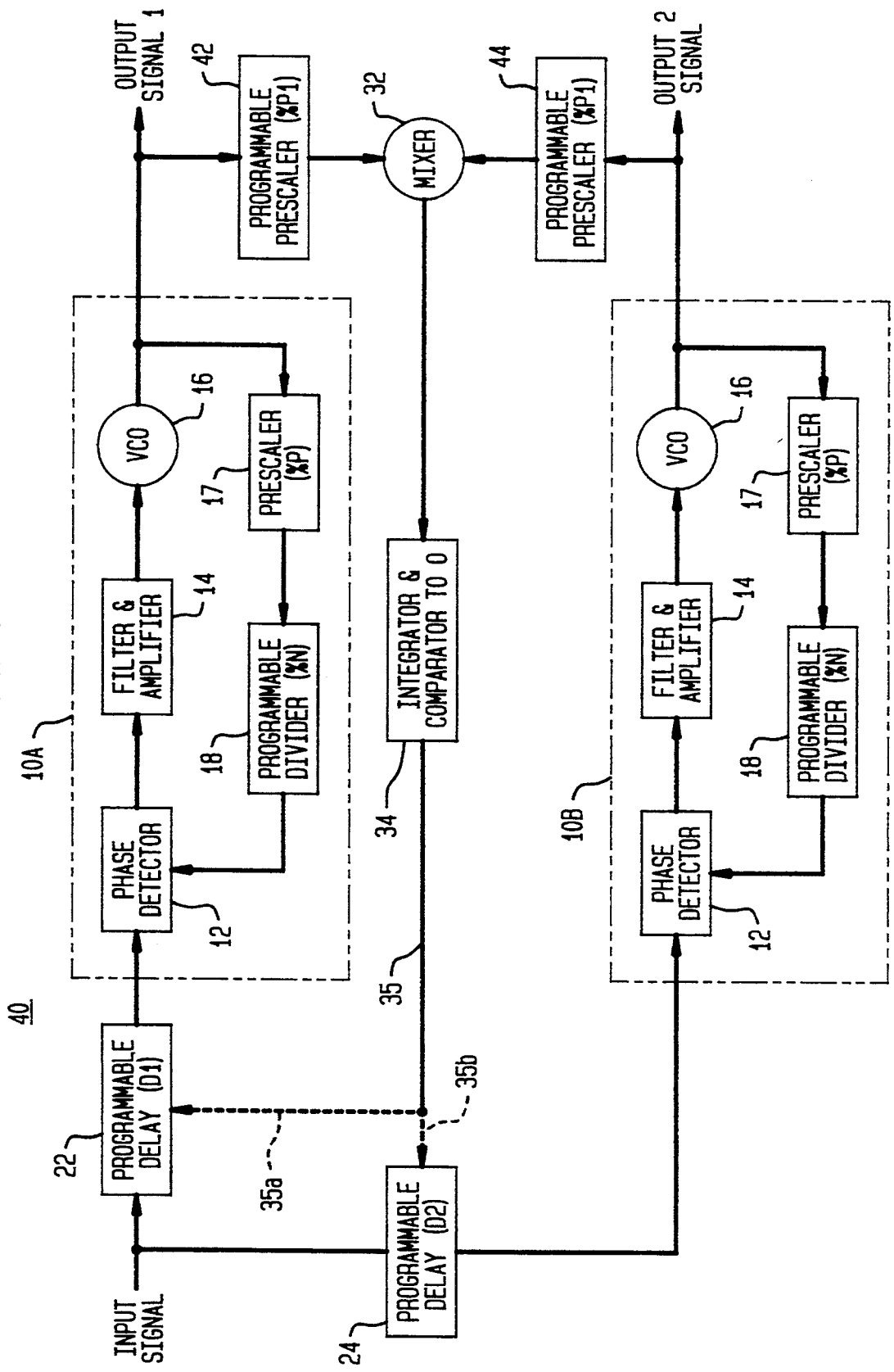
FIG. 4 is a block diagram of apparatus for generating two output signals with a constant phase difference from a single input reference signal in accordance with a third embodiment of the present invention.

Referring now to FIG. 4, there is shown a block diagram of apparatus 40 for generating two output signals with a constant predetermined phase difference of 90 degrees or any multiple of 90 degrees from a single input reference signal in accordance with a third embodiment of the present invention. Apparatus 40 comprises a first Programmable Delay 22, a second Programmable Delay 24, a first Synthesizer 10A, a second Synthesizer 10B, a first Programmable Prescaler 42, a second Programmable Prescaler 44, a Mixer 32, and an Integrator and Comparator to Zero 34, where each of the Synthesizers 10A and 10B is essentially the same as the Synthesizer 10 of FIG. 1. The apparatus 40 is very similar to the apparatus 30 of FIG. 3 with the exception that in the apparatus 40, the first and second Programmable Prescalers 42 and 44 are interjected between the outputs of the Synthesizers 10A and 10B, respectively, and the associated inputs to Mixer 32. In apparatus 40, an input reference signal (INPUT SIGNAL) having a predetermined frequency and phase is transmitted to an input of each of the first and second Programmable Delays 22 and 24. The output from the first Programmable Delay 22 is coupled to an input of the first Synthesizer 10A, and the output from the second Programmable Delay 24 is coupled to an input of the second Synthesizer 10B. The first and second Synthesizers 10A and 10B generate separate output signals designated OUTPUT SIGNALS 1 and 2, respectively. The arrangement and operation of the Programmable Delays 22 and 24 and the first and Synthesizers 10A and 10B corresponds to the arrangement and operation of the corresponding elements of arrangements 20 of FIG. 2 and 30 of FIG. 3.

In operation, the output signals from the first and second Synthesizers 10A and 10B are coupled to the first and second Programmable Prescalers 42 and 44, respectively. The Programmable Prescalers 42 and 44 divide the received output signal from the first and second Synthesizers 10A and 10B, respectively, by a predetermined divisor designated P1. P1 represents a predetermined dividing percentage or number. Output signals from the first and second Programmable Prescalers 42 and 44 are provided as separate inputs to the Mixer 32. The Mixer 32 and the Integrator and Comparator To Zero 34 function as described for the corresponding elements in the apparatus 30 of FIG. 3. More particularly, the comparator-to-zero section of the Integrator and Comparator To Zero 34 compares the DC voltage from the Mixer 32 and produces a DC output voltage equal to zero when the $\cos[(Y1/P1)-(Y2/P1)]$ equals zero. This implies that $Y1/P1 - Y2/P1 = 90$ degrees, or $Y1 - Y2 = (P1)(90$ degrees$)$.

As shown in the last expression, by simply changing (programming) the division ratio P1 stored in both of the Programmable Prescalers 42 and 44, different multiples of 90 degrees can be obtained. For example, if P1 is the integer 1, then the resultant phase difference obtained is 90 degrees, whereas if P1 is equal to 1.5 then the resultant phase difference obtained is 135 degrees, etc. This simplifies the integration of the apparatus 40 in digital form because the Programmable Prescalers 42 and 44 divide the output frequency of the Synthesizers 10A and 10B to a frequency range that can be handled by an Exclusive OR (XOR) mixer which is a digital version of a mixer or multiplier.

Figure 5:
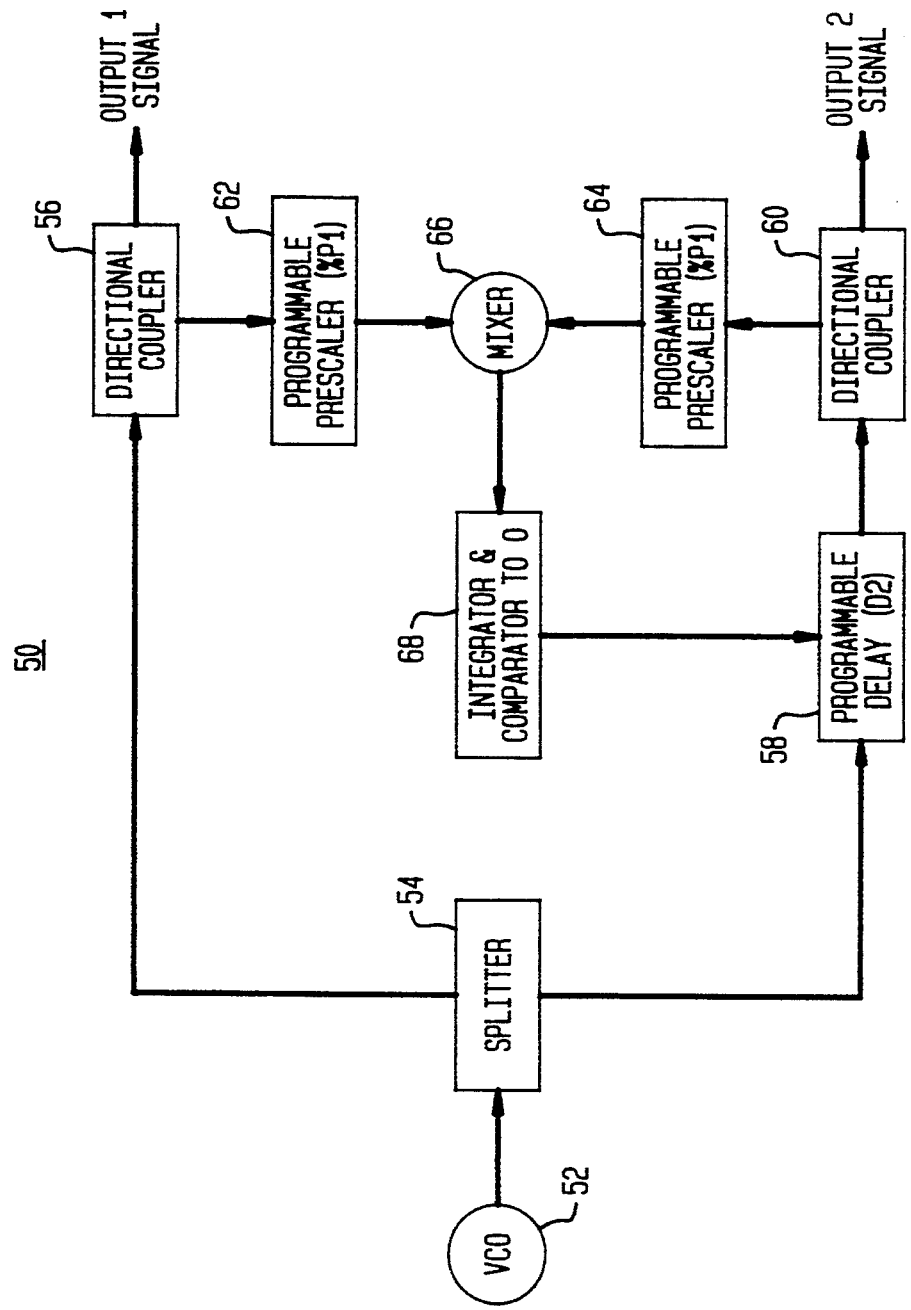
FIG. 5 is a block diagram of apparatus for generating two output signals with a constant phase difference from a single input reference signal in accordance with a fourth embodiment of the present invention.

Referring now to FIG. 5, there is shown apparatus 50 for generating two output signals with a constant predetermined phase difference from a single input reference signal in accordance with a fourth embodiment of the present invention. The apparatus 50 comprises a Voltage Controlled Oscillator (VCO) 52, a Splitter 54, a first Directional Coupler 56, a Programmable Delay 58, a second Directional Coupler 60, a first Programmable Prescaler 62, a second Programmable Prescaler 64, a Mixer 66, and an Integrator and Comparator To Zero 68. An output of the VCO 52 is coupled to an input of the Splitter 54. First and second outputs from the Splitter 54 are coupled to a first input of the first Directional Coupler 56 and an input of the Programmable Delay 58, respectively. A first output of the first Directional Coupler 56 is coupled to an input of the first Programmable Prescaler 62, and a second output of the first Directional Coupler 56 provides a first output (OUTPUT SIGNAL 1) of the apparatus 50. An output of the Programmable Delay 58 is coupled to an input of the second Directional Coupler 60. A first output of the second Directional Coupler 60 is coupled to an input of the second Programmable Prescaler 64, and a second output of the first Directional Coupler 56 provides a second output (OUTPUT SIGNAL 2) of the apparatus 50. Outputs from the first and second Programmable Prescalers 62 and 64 are coupled to separate inputs of the Mixer 66. An output of the Mixer 66 is coupled to an input of the Integrator and Comparator To Zero 68, and an output of the Integrator and Comparator To Zero 68 is coupled to a second input of the Programmable Delay 58.

In operation, the VCO 52 generates an output signal having a predetermined frequency and phase which is split into a first and a second equal part by the Splitter 54. The first part of the output signal from the VCO 52 is transmitted to the first Directional Coupler 56 which directs a first portion thereof to the first output (OUTPUT SIGNAL 1) of the apparatus 50, and a second portion thereof to the Programmable Prescaler 62. Concurrent therewith, the second part of the output signal from the VCO 52 is received from the Splitter 54 by the Programmable Delay which introduces a delay D2 into the received second part signal, and transmits the delayed second part signal to the second Directional Coupler 60. The second Directional Coupler 60 directs a first portion of the received delayed second part signal to the second output (OUTPUT SIGNAL 2) of the apparatus 50, and a second portion thereof to the Programmable Prescaler 64. The Programmable Prescalers 62 and 64 each divide the received second portion signals from the first and second Directional Couplers 56 and 60, respectively, by a predetermined divisor designated P1 to generate separate respective first and second prescaler output signals. The first and second prescaler output signals from the first and second Programmable Prescalers 62 and 64, respectively, are multiplied in the Mixer 66. The first and second Programmable Prescalers 62 and 64, the Mixer 66 and the Integrator and Comparator To Zero 68 function as described for the first and second Programmable Prescalers 42 and 44, Mixer 32 and Integrator and Comparator To Zero 34 in the apparatus 40 of FIG. 4. Effectively, the Mixer 66 produces a DC signal representative of the phase difference between the first and second output signals from apparatus 50. The Integrator and Comparator To Zero 68 uses the DC signal from the Mixer 66 to generate a control signal to the Programmable Delay 58. The Programmable Delay 58 uses this control signal to change the delay D2 as necessary to maintain a predetermined constant phase difference between the first and second output signals from the apparatus 50. As described hereinbefore for the apparatus 40 of FIG. 4, by simply changing (programming) the division ratio P1 used in both of the Programmable Prescalers 62 and 64, different multiples of 90 degrees can be obtained. Similarly, by changing (programming) a different delay D2 into Programmable Delay 58, a different predetermined phase difference between the two output signals from apparatus 50 can be achieved.

It is to be appreciated and understood that the specific embodiments of the invention described hereinbefore are merely illustrative of the general principles of the invention. Various modifications may be made by those skilled in the art which are consistent with the principles set forth.

What is claimed is:

1. Apparatus for providing a first and a second output signal with a predetermined phase difference therebetween from an input reference signal having a predetermined frequency and phase comprising:

splitting means for receiving the input reference signal and providing corresponding first and second split output signals therefrom;

programmed phase delay means for introducing a separate selective predetermined programmed phase delay into at least one of the corresponding first and second split output signals received from the splitting means for generating first and second output signals from the programmed phase delay means having a predetermined phase difference therebetween; and generating means responsive only to the first and second output signals from the programmed phase delay means for generating therefrom the first and second output signals, respectively, from the apparatus having said predetermined phase difference therebetween.

2. The apparatus of claim 1 wherein:
the programmed phase delay means stores a programmable delay for introducing the programmable delay into the second one of the first and second split output signals from the splitting means for generating the first and second output signals from the programmed phase delay means; and
the generating means comprises control loop signaling means for receiving a portion of each of the first and second output signals from the apparatus and generating therefrom a control signal to the programmed phase delay means for adjusting the programmable delay for maintaining the predetermined phase difference between the first and second output signals of the apparatus.

3. The apparatus of claim 2 wherein the control loop signaling means comprises:
a first programmable prescaler for receiving the first output signal from the apparatus and dividing said first output signal by a predetermined divisor to generate a first prescaler output signal;
a second programmable prescaler for receiving the second output signal from the apparatus and dividing said second output signal by a predetermined divisor having a same value as the predetermined divisor used by the first programmable prescaler to generate a second prescaler output signal;
mixing means for multiplying the first prescaler output signal and the second prescaler output signal to generate an output signal having a DC component; and
integrating and comparing to zero mean for receiving the output signal from the mixing means and generating therefrom an output control signal to the programmed phase delay means for adjusting the phase introduced by the programmed phase delay means to maintain the predetermined phase difference between the first and second output signals from the programmed phase delay means.

4. The apparatus of claim 1 wherein the programmed phase delay means comprises:
a first programmable delay for introducing a predetermined phase delay into the first output signal from the splitting means for generating a first delayed output signal; and
a second programmable delay for introducing a predetermined phase delay into the second output signal from the splitting means for generating a second delayed output signal; and
the generating means comprises:
a first synthesizer for receiving the first delayed output signal and generating therefrom the first output signal from the apparatus having a predetermined frequency and phase; and
a second synthesizer for receiving the second delayed output signal and generating therefrom the second output signal from the apparatus having a predetermined frequency which is the same as the frequency of the output signal from the first synthesizer, and a predetermined phase that substantially differs from the first output signal from the apparatus by said predetermined phase difference.

5. The apparatus of claim 4 wherein the programmed phase delay generating means further comprises:
control loop signaling means for receiving each of the first and second output signals from the apparatus and generating therefrom a control signal to one of the first and second programmable delays for maintaining the predetermined phase difference between the first and second output signals from the apparatus.

6. The apparatus of claim 5 wherein the control loop signaling means comprises:
mixing means for receiving and multiplying the first and second output signals from the apparatus to generate therefrom an output signal having a DC component; and
integrator and comparator to zero means for receiving the output signal from the mixing means and generating an output control signal to the one of the first and second programmable delays for adjusting the phase introduced by the one of the first and second programmable delays to maintain the predetermined phase difference between the first and second output signals from the apparatus.

7. The apparatus of claim 6 wherein the control loop signaling means further comprises:
a first programmable prescaler for receiving the first output signal from the first synthesizer and dividing said first output signal by a predetermined divisor to generate a first prescaler output signal for transmission to the mixing means; and
a second programmable prescaler for receiving the second output signal from the second synthesizer and dividing said second output signal by a predetermined divisor having a same value as the predetermined divisor used by the first programmable prescaler to generate a second prescaler output signal for transmission to the mixing means.

8. The apparatus of claim 1 further comprising:
oscillator means for generating the input reference signal with a predetermined frequency and phase; and
the splitting means for receiving the input reference signal and providing a first and a second output signal therefrom comprises a splitter, 9. Apparatus for providing first and second output signals with a predetermined phase difference therebetween from an input reference signal comprising:
receiving means for receiving the input reference signal and providing corresponding first and a second corresponding output signals therefrom;
a first programmable delay for introducing a predetermined phase delay into the first output signal from the receiving means for generating a first delayed output signal;
a first synthesizer for receiving the first delayed output signal and generating therefrom the first output signal from the apparatus having a predetermined frequency and phase;
a second programmable delay for introducing a predetermined phase delay into the second output signal from the receiving means for generating a second delayed output signal, the second delayed output signal having a phase difference from the first delayed output signal from the first programmable delay that corresponds to the predetermined phase difference desired between the first and second output signals from the apparatus; and
a second synthesizer for receiving the second delayed output signal and generating therefrom the second output signal from the apparatus having both a predetermined frequency which is the same as the frequency of the output signal from the first synthesizer, and a predetermined phase that substantially differs from the first output signal by said predetermined phase difference.

10. The apparatus of claim 9 further comprising a control loop signaling means comprising:

mixing means for receiving and multiplying the first and second output signals from the apparatus to generate an output signal having a DC component; and integrator and comparator to zero means for receiving the output signal from the mixing means and generating an output control signal to one of the first and second programmable delay for adjusting the phase introduced by said one of the first and second programmable delays to maintain the predetermined phase difference between the first and second output signals from the apparatus.

11. The apparatus of claim 10 wherein the control loop signaling means further comprises:

a first programmable prescaler for receiving the first output signal from the first synthesizer and dividing the first output signal by a predetermined divisor to generate a first prescaler output signal for transmission to the mixing means; and a second programmable prescaler for receiving the second output signal and dividing the second output signal by a predetermined divisor having a same value as the predetermined divisor used by the first programmable prescaler to generate a second prescaler output signal for transmission to the mixing means.

12. A method of providing first and second apparatus output signals with a predetermined phase difference therebetween from an input reference signal comprising the steps of:

(a) receiving the input reference signal and providing corresponding first and a second output signals therefrom;

(b) introducing a predetermined phase delay into the first output signal obtained in step (a) with a first programmable delay for generating a first delayed output signal;

(c) receiving the first delayed output signal at a first synthesizer and generating therefrom the first apparatus output signal having a predetermined frequency and phase;

(d) introducing a predetermined phase delay into the second output signal obtained in step (a) with a second programmable delay for generating a second delayed output signal, the second delayed output signal having a phase difference from the first delayed output signal from the first programmable delay that corresponds to the predetermined phase difference desired between the first and second output signals from the apparatus; and (e) receiving the second delayed output signal at a second synthesizer and generating therefrom the second apparatus output signal having a predetermined frequency which is the same as the frequency of the output signal from the first synthesizer, and a predetermined phase that substantially differs from the first apparatus output signal by said predetermined phase difference.

13. The method of claim 12 comprising the further step of:

(f) receiving a portion of each of the first and second apparatus output signals in a control loop signaling means for generating therefrom a control signal to control adjustments of one of the predetermined phase delays introduced in either one of steps (b) or (d).

14. The method of claim 13 wherein step (f) comprises the substeps of:

(f1) multiplying the first output signal and the second output signal in a mixing means for generating an output signal having a DC component; and (f2) integrating and comparing to zero the output signal from the mixing means and generating an output control signal for adjusting the phase introduced in either one of steps (b) or (d) to maintain the predetermined phase difference between the first and second apparatus output signals.

15. The method of claim 14 wherein step (f) further comprises the substeps of;

(f3) prior to performing step (f1), receiving the first apparatus output signal in a first programmable prescaler and dividing the first output signal by a predetermined divisor to generate a first prescaler output signal for use in step (f1); and (f4) prior to performing step (f1), receiving the second output signal in a second programmable prescaler and dividing the second output signal by a predetermined divisor having a same value as the predetermined divisor used by the first programmable prescaler to generate a second prescaler output signal for use in step (f1).

16. A method of providing a first and a second output signal from an apparatus with a predetermined phase difference therebetween from an input reference signal having a predetermined frequency and phase comprising the steps of:

(a) receiving the input reference signal at a splitting means for providing corresponding first and second split output signals;

(b) introducing a separate selective predetermined programmed phase delay with a programmed phase delay means into at least one of the corresponding first and second split output signals received from the splitting means for generating first and second output signals having a predetermined phase difference therebetween from the first and second split output signals, respectively; and (c) generating first and second output signals from the apparatus having said predetermined phase difference therebetween from only the first and second output signals, respectively, generated in step (b) with a generating means that is responsive to the first and second output signals from step (b).

17. The method of claim 16 wherein in performing step (b) performing the substeps of:

(b1) introducing a predetermined phase delay into a second one of the first and second output signals with a programmable delay; and (b2) receiving a portion of each of the first and second output signals from the apparatus in a control loop signaling means for generating therefrom a control signal to the programmable delay for maintaining the predetermined phase difference between the first and second output signals of the apparatus.

18. The method of claim 17 wherein in performing step (b2) performing the substeps of:

(b3) receiving the first output signal from the apparatus at a first programmable prescaler for dividing said first output signal by a predetermined divisor to generate a first prescaler output signal;

(b4) receiving the second output signal from the apparatus at a second programmable prescaler for dividing said second output signal by a predetermined divisor having a same value as the predetermined divisor used by the first programmable prescaler in step (b3) to generate a second prescaler output signal;

(b5) multiplying the first prescaler output signal and the second prescaler output signal generated in steps (b3) and (b4) in a mixing means for generating an output signal having a DC component; and (b6) receiving the output signal generated in step (b5) at a integrating and comparing to zero means for generating therefrom an output control signal to the programmable delay for adjusting the phase introduced in step (b) to maintain the predetermined phase difference between the first and second output signals of the apparatus.

19. The method of claim 16 wherein in performing step (b), performing the substeps of:

(b1) introducing a predetermined phase delay into the first output signal generated in step (a) at a first programmable delay for generating a first delayed output signal; and (b2) introducing a predetermined phase delay into the second output signal obtained in step (a) at a second programmable delay for generating a first delayed output signal; and in performing step (c), performing the substeps of:

(c1) receiving the first delayed output signal generated in step (b1) at a first synthesizer for generating therefrom the first output signal from the apparatus having a predetermined frequency and phase; and (c2) receiving the second delayed output signal generated in step (b2) at a second synthesizer for generating therefrom the second output signal from the apparatus having a predetermined frequency which is the same as the frequency of the output signal from the first synthesizer, and a predetermined phase that substantially differs from the first output signal from the apparatus by said predetermined phase difference.

20. The method of claim 19 wherein in performing steps (c1) and (c2), performing the substep of:

(c3) receiving each of the first and second output signals from the apparatus at a control loop signaling means for generating therefrom a control signal to one of the first and second programmable delays of substeps (b1) and (b2) for maintaining the predetermined phase difference between the first and second output signals from the apparatus.

21. The apparatus of claim 20 wherein in performing step (c3), performing the substeps of:

(c4) receiving and multiplying the first and second output signals from the apparatus at a mixing means for generating therefrom an output signal having a DC component; and (c5) receiving the output signal from the mixing means in step (c4) at a integrator and comparator to zero means for generating an output control signal to the programmable delay for adjusting the phase introduced by one of the first and second programmable delays to maintain the predetermined phase difference between the first and second output signals from the apparatus.

22. The method of claim 21 wherein in performing step (c3), performing the further substeps of:

(c6) prior to performing step (c3), receiving the first output signal from the first synthesizer at a first programmable prescaler for dividing said first output signal by a predetermined divisor to generate a first prescaler output signal for transmission to the mixing means; and (c7) prior to performing step (c3), receiving the second output signal from the second synthesizer at a second programmable prescaler for dividing said second output signal by a predetermined divisor having a same value as the predetermined divisor used by the first programmable prescaler to generate a second prescaler output signal for transmission to the mixing means.

* * * * *